United States Patent
Rigon (10) Patent No.: US 9,115,423 B2
(45) Date of Patent: Aug. 25, 2015

(54) METHODS AND SYSTEMS FOR MONITORING AND CONTROLLING SILICON ROD TEMPERATURE

(75) Inventor: Enrico Rigon, Merano (IT)

(73) Assignee: MEMC Electronic Materials S.p.A., Novara (IT)

(*) Notice: Subject to any disclaimer, the term of this patent is extended or adjusted under 35 U.S.C. 154(b) by 120 days.

(21) Appl. No.: 13/543,226

(22) Filed: Jul. 6, 2012

(65) Prior Publication Data

US 2013/0017139 A1    Jan. 17, 2013

Related U.S. Application Data

(60) Provisional application No. 61/507,405, filed on Jul. 13, 2011.

(51) Int. Cl.

| | |
|---|---|
| *G01J 5/00* | (2006.01) |
| *G01K 13/00* | (2006.01) |
| *C23C 16/24* | (2006.01) |
| *C01B 33/035* | (2006.01) |
| *C23C 16/46* | (2006.01) |
| *C23C 16/52* | (2006.01) |
| *G05D 23/27* | (2006.01) |

(52) U.S. Cl.
CPC ............ *C23C 16/24* (2013.01); *C01B 33/035* (2013.01); *C23C 16/46* (2013.01); *C23C 16/52* (2013.01); *G05D 23/27* (2013.01)

(58) Field of Classification Search
USPC ......................................... 374/141, 120, 124
See application file for complete search history.

(56) References Cited

U.S. PATENT DOCUMENTS

| | | | |
|---|---|---|---|
| 4,659,421 | A | 4/1987 | Jewett |
| 6,544,333 | B2 | 4/2003 | Keck et al. |
| 2010/0111511 | A1 | 5/2010 | Merry et al. |
| 2011/0014468 | A1 | 1/2011 | Urushihara et al. |
| 2012/0027916 | A1 | 2/2012 | Wilfried et al. |

FOREIGN PATENT DOCUMENTS

WO    2010086363 A2    8/2010

OTHER PUBLICATIONS

Patel, V., Wafer temperature measurements and end-point detection during plasma etching by thermal imaging, Applied Physics Letters, Sep. 9, 1991, pp. 1299-1301, vol. 59, No. 9, New York.
PCT International Search Report and Written Opinion of the International Searching Authority mailed on Oct. 26, 2012 regarding PCT/EP2012/063599 filed on Jul. 11, 2012, 10 pgs.

*Primary Examiner* — Mirellys Jagan
(74) *Attorney, Agent, or Firm* — Armstrong Teasdale LLP (57) ABSTRACT

Systems and methods are disclosed for monitoring and controlling silicon rod temperature. One example is a method of monitoring a surface temperature of at least one silicon rod in a chemical vapor deposition (CVD) reactor during a CVD process. The method includes capturing an image of an interior of the CVD reactor. The image includes a silicon rod. The image is scanned to identify a left edge of the silicon rod and a right edge of the silicon rod. A target area is identified midway between the left edge and the right edge. A temperature of the silicon rod in the target area is determined.

20 Claims, 6 Drawing Sheets

METHODS AND SYSTEMS FOR MONITORING AND CONTROLLING SILICON ROD TEMPERATURE

CROSS REFERENCE

This application claims priority to U.S. Provisional Application No. 61/507,405 filed on Jul. 13, 2011, the entire disclosure of which is hereby incorporated by reference in its entirety.

FIELD

This disclosure generally relates to systems and methods for monitoring silicon rod temperature and, more specifically, to systems and methods for monitoring a silicon rod surface temperature based on digital image analysis.

BACKGROUND

Ultrapure polysilicon used in the electronic and solar industry is often produced through deposition from gaseous reactants via a chemical vapor deposition (CVD) process conducted within a reactor.

One process used to produce ultrapure polycrystalline silicon in a CVD reactor is referred to as a Siemens process. Silicon rods disposed within the reactor are used as seeds to start the process. Gaseous silicon-containing reactants flow through the reactor and deposit silicon onto the surface of the rods. The gaseous reactants (i.e., gaseous precursors) include silicon halides such as trichlorosilane mixed with a suitable carrier gas, generally hydrogen. Because trichlorosilane is kinetically stable, CVD processes are rather slow and commonly utilize relatively high temperatures to permit the deposition to occur. It is not uncommon to utilize rod surface temperature greater than 1000° C. Under such conditions the gaseous reactants decompose on the surface of the rods. Silicon is thus deposited on the rods according to the following global reaction:

$SiHCl_3 + H_2 \rightarrow Si + 3HCl$.

The process is stopped after the rods grow to the desired diameter. The rods are then extracted from the CVD reactor and the silicon is harvested from the rods for further processing.

During the CVD process, the surface temperature of the silicon rods typically needs to be controlled. If the surface temperature is too high, excessive silicon dust may be produced. If the surface temperature is too low, the deposition may be slow or may not even occur.

The Siemens process employs Joule heating to achieve desired surface temperatures. Electrical energy is converted into thermal energy to heat up the silicon rods. Electrical current is provided to the reactor by a power supply that adjusts the voltage supplied across each rod in order to control the current intensity, and thus the temperature of the rod.

During the deposition process, however, the power demand of the reactor is not constant. The heat flux leaving the silicon rods increases with the deposition time as the surface area of the rod increases. Accordingly, the current through the rods is constantly adjusted in order to maintain the desired rod surface temperature.

At least one known method of controlling rod temperature utilizes a pyrometer to monitor the rod surface temperature. When the monitored temperature deviates from a desired set point, electrical intensity is adjusted to attempt to return the rod surface temperature to the desired set point. Pyrometers generally determine the temperature of a target spot on a silicon rod from the intensity of the radiation emitted at a certain wavelength or range of wavelengths according to Planck's radiation law.

However, pyrometers must be properly calibrated and aimed to a suitable target which preferably is a smooth homogeneous spot of the silicon rod of interest. Furthermore, monitoring rod surface temperature using a pyrometer imposes other difficulties. These difficulties include the presence of local hot or cold spots, pyrometers aimed out of target, and movement of a rod out of target, among other possible difficulties.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

One aspect of the present disclosure is a method of monitoring a surface temperature of at least one silicon rod in a chemical vapor deposition (CVD) reactor during a CVD process. The method includes capturing an image of an interior of the CVD reactor. The image includes a silicon rod. The method includes scanning the image to identify a left edge of the silicon rod and a right edge of the silicon rod, identifying a target area midway between the left edge and the right edge, and determining a temperature of the silicon rod in the target area.

Another aspect of the present disclosure is a system including a chemical vapor deposition (CVD) reactor including an interior, a plurality of silicon rods coupled within the interior of the CVD reactor, an imaging device positioned to capture an image of the interior of the CVD reactor and one silicon rod of the plurality of silicon rods, and a controller. The controller is configured to scan the image to identify a left edge of the silicon rod and a right edge of the silicon rod, identify a target area midway between the left edge and the right edge, and determine a temperature of the silicon rod in the target area.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

The embodiments described herein generally relate to systems and methods for monitoring and controlling temperature in a polysilicon reactor. More specifically embodiments described herein relate to monitoring and controlling a silicon rod surface temperature using digital image analysis.

Figure 1:
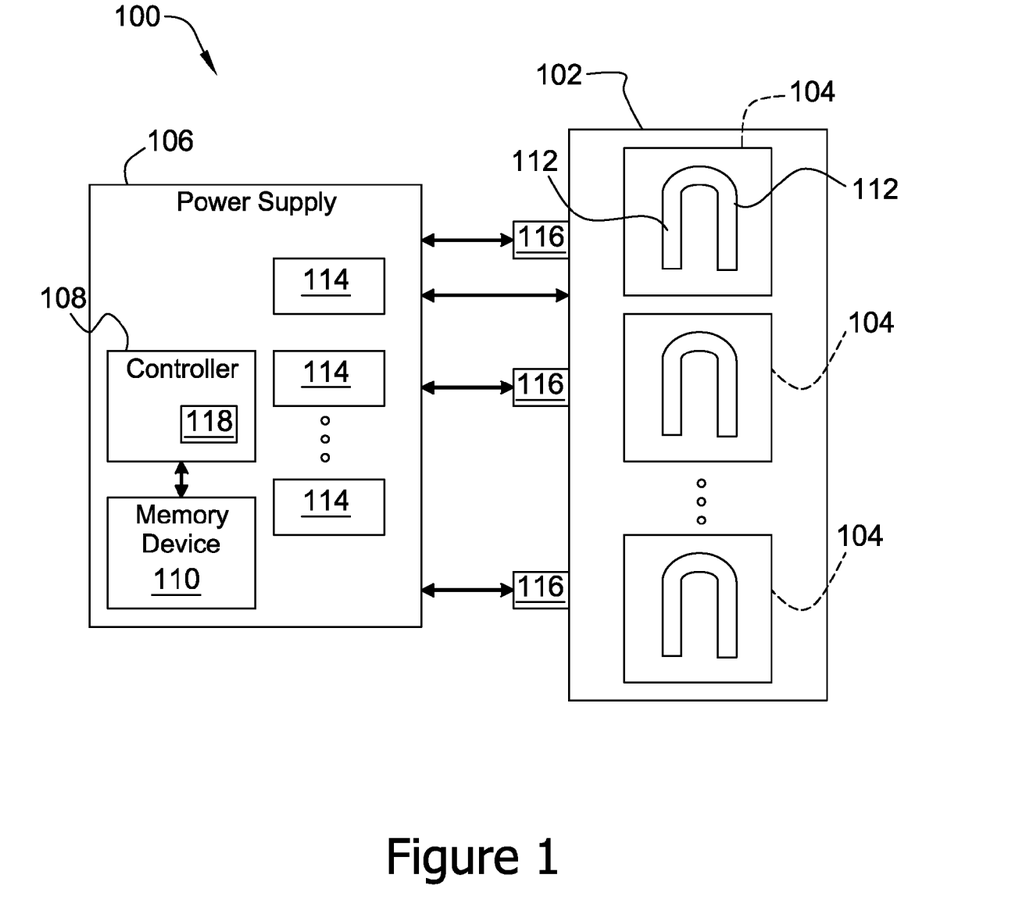
FIG. 1 is a block diagram of an exemplary system including a power supply and a reactor.

A block diagram of an exemplary system, generally indicated by reference numeral 100, according to the present disclosure is illustrated in FIG. 1. System 100 includes a reactor 102 having a plurality of silicon rod groups 104. A power supply 106 is coupled to reactor 102. More particularly, power supply 106 is coupled to silicon rod groups 104. Power supply 106 includes a controller 108 and a memory device 110. Imaging devices 116 are coupled to reactor 102, such as via a sight glass (not shown), to image one or more rod of silicon rod groups 104 and provide image data to controller 108.

In some embodiments, reactor 102 is a chemical vapor deposition (CVD) reactor. More specifically, in some embodiments, reactor 102 is a Siemens reactor. In other embodiments, reactor 102 may be any other suitable polysilicon reactor.

In the illustrated embodiment, each silicon rod group 104 includes a pair of series connected silicon rods 112. In other embodiments, silicon rod groups 104 may include any number of series connected silicon rods 112 (whether connected in pairs or not). In some embodiments, each silicon rod group 104 includes six silicon rods 112 connected in series. Current through the series connected silicon rods 112 (i.e., through each silicon rod group 104) is controlled to control the surface temperature of silicon rods 112. System 100 may include any suitable number of silicon rods 112, however configured and/or grouped. For example, system 100 may include 12, 18, 36, 48, 54, or 84 silicon rods.

In the exemplary embodiment, power supply 106 includes a plurality of power converters 114. Each power converter 114 is coupled to output power to a different silicon rod group 104. In other embodiments, power supply 106 may include a single power converter 114 coupled to two or more of the silicon rod groups 104 (including, in some embodiments, all silicon rod groups 104). In some embodiments, power supply 106 may use one or more silicon controlled rectifiers with phase control to adjust the output current to one or more silicon rod groups 104. In some embodiments, power supply 106 may include an inverter with adjustable DC output to control the output current to one or more silicon rod groups 104. Power converters 114 may have any suitable topology including, for example, buck, boost, flyback, forward, full-bridge, or a combination thereof.

Controller 108 may be an analog controller, a digital controller, or a combination of analog and digital controllers/components. In embodiments in which controller 108 is a digital controller, controller 108 may include a processor, computer, etc. Although controller 108 is illustrated within power supply 106 in the FIG. 1, controller 108 may, additionally or alternatively, be external to power supply 106. For example, functions described as performed by controller 108 may be performed, completely or partially, by a separate controller, such as a system controller, for example.

Memory device 110 is one or more devices that enable information such as executable instructions and/or other data to be stored and retrieved. Memory device 110 may include one or more computer readable media, such as, without limitation, dynamic random access memory (DRAM), static random access memory (SRAM), a solid state disk, and/or a hard disk. Memory device 110 may be configured to store, without limitation, computer-executable instructions, algorithms, results, and/or any other type of data. In some embodiments, memory device 110 is integrated in controller 108. In other embodiments memory device is external to controller 108 and/or power supply 106.

In the exemplary embodiment, imaging devices 116 are digital cameras equipped with a charge-coupled device (CCD) sensor. Imaging devices 116 are used to measure the intensity of emitted radiation from silicon rods 112, as will be described in more detail below. Accordingly, imaging devices 116 may be any sensor configured to sense wavelengths ranging within the visible spectrum including, for example, complementary metal-oxide-semiconductor (CMOS) imaging devices. In still other embodiments, imaging devices 116 may be optical devices operable to sense different wavelengths including, for example, infrared wavelengths, ultraviolet wavelengths, etc. In the exemplary embodiment, imaging devices 116 are scan area cameras. In other embodiments, imaging devices may be linear cameras. Scan area cameras are focused on a two-dimensional target, generally a rectangle, whose dimensions are customizable. In embodiments including a linear camera, the target is generally a line of variable length.

Controller 108 includes a signal analyzer 118 that converts the radiation intensity monitored by imaging devices 116 into a temperature value. Although illustrated as part of controller 108, signal analyzer 118 may be incorporated in a separate controller, such as a system controller, a stand-alone controller, a camera controller, etc., and/or may be incorporated in imaging devices 116. Furthermore, any number of appropriate signal analyzers 118 may be utilized in system 100. Signal analyzer 118 may include any suitable commercial software package for digital image analysis or may include custom designed algorithms and/or software. In the exemplary embodiment, signal analyzer 118 converts the signal of radiation intensity, received from an imaging device 116, into a temperature measurement by comparison between the spectral response of the imaging device 116 aimed at one or more silicon rods 112 and the spectral response of an imaging device 116 aimed at a reference source of electromagnetic radiation at a known temperature. Such reference source may be a calibration black body whose temperature is accurately monitored.

The exemplary embodiment monitors and controls surface temperature of silicon rods 112 groups in reactor 102 without relying on a pyrometer. Instead, power supply 106 uses a feedback control scheme based on radiation emitted by silicon rods 112 as monitored by imaging devices 116.

Silicon rods 112 are installed inside reactor 102 prior to start up and are constantly heated up at a temperature ranging between about 980° C. and about 1200° C. via Joule heating. Silicon rods 112 act as resistors which dissipate electrical current into thermal energy. The intensity of the electrical current is adjusted by a feedback control scheme in order to maintain the desired set point of temperature.

As initially installed in reactor 102, silicon rods 112, also referred to as "slim rods", are generally square or rectangular in cross-section with characteristic dimensions ranging between about 5 to about 15 millimeters. In other embodiments, silicon rods may have hollow cylindrical or long slab shapes. These initial slim rods serve as germs to start the deposition process. Depending on many parameters, including the fluid dynamics of the gases inside reactor 102 and the geometry of the silicon rods 112, silicon rods 112 tend to oscillate in a range from a few millimeters to a few centimeters. This oscillation is commonly caused by shear stress exerted by the gases in reactor 102 on the surface of the silicon rods 112. Such oscillations may cause a fixed target aimed by, for example, a pyrometer to fall off the surface of silicon rod 112 for a period of time until the silicon rod 112 returns to its position of repose. The oscillating motion persists until the diameter of the silicon rods 112 increases, the inertia of the silicon rods 112 increases, and/or silicon deposits on top of a graphite chuck (not illustrated) in which each silicon rod 112 is inserted. In some embodiments, the transitory time, i.e. the time during which silicon rods 112 oscillate, may last for several hours depending on operating parameters of reactor 102 and the deposition rate of silicon. Until the motion of silicon rods 112 ceases, the temperature measured at a fixed target location, such as with a pyrometer, may be inaccurate and the electrical power fed to reactor 102 may not be an optimal value.

Figure 2:
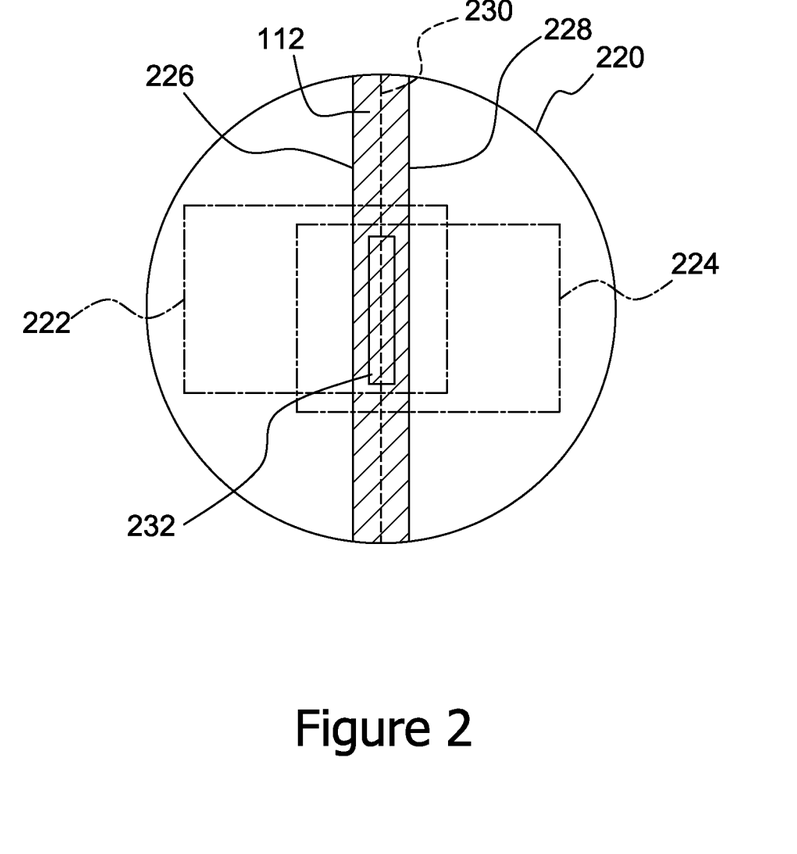
FIG. 2 is an illustration of a field of view of an imaging device of the system of FIG. 1, the field of view including a silicon rod.

Instead of using a fixed target, imaging system 100 dynamically identifies a target area on silicon rods 112. Referring to FIG. 2, imaging device 116 has a field of view 220. In this and the subsequent Figures, imaging device 116 is a scan area camera with a rectangular target 232. In FIG. 2, one of silicon rods 112 is within field of view 220. A temperature field of silicon rod 112 and its surroundings is identified using imaging device 116 and signal analyzer 118 as described herein. Two overlapping rectangular scan areas 222 and 224 are defined within field of view 220, and accordingly within the temperature field, such that silicon rod 112 will be found within at least one of scan areas 222 and 224 regardless of the motion of silicon rod 112.

The vertical position of scan areas 222 and 224 is mainly defined by the position of the sight glass (not shown) where imaging device 116 is mounted. Within the field of view of imaging device 116 all possible vertical positions where target 232 may be identified are suitable. The position of target 232 may vary along a vertical line of about few centimeters at most, which generally does not affect the accuracy of the temperature measurement.

Each scan area 222 and 224 is divided into smaller regions, called pixels (not illustrated). For each pixel, the measured temperature is a constant. The number of pixels of imaging devices 116, also referred to as resolution, may determine the accuracy of temperature measurement according to the present disclosure.

To measure the temperature of silicon rod 112, scan areas 222 and 224 are examined to attempt to locate a vertical left edge 226 and a vertical right edge 228 of silicon rod 112. A location midway between left edge 226 and right edge 228 (i.e., approximately halfway between left edge 226 and right edge 228) is determined to be a center 230 of silicon rod 112. Surface temperature of silicon rod 112 is determined within a target area 232 centered on determined center 230 of silicon rod 112. Thus, target 232 will remain generally aligned with the actual center of silicon rod 112 despite any movement of silicon rod 112. Although target 232 is illustrated as a rectangular shape in FIG. 2, target 232 may have any other suitable shape including, for example, round, oval, square, hexagonal, etc. Moreover, the location midway between left edge 226 and right edge 228 is selected to approximate the center of silicon rod 112 and need not be the exact midpoint between left edge 226 and right edge 228.

The edges 226 and 228 are located based on temperature measurements for pixels within scan areas 222 and 224. More particularly, edges 226 and 228 are determined by identifying transitions from a relatively lower temperature, indicating the area around silicon rod 112, to a higher temperature, indicating the surface of silicon rod 112. A temperature threshold may be used to identify the transitions that indicate the location of edges 226 and 228. The temperature threshold may be, for example, a temperature difference, a fixed temperature threshold, and/or a variable temperature threshold. For example, an edge may be identified by identifying a temperature difference greater than a threshold, by identifying a temperature difference greater than a first threshold where the higher temperature exceeds a second threshold, by identifying a temperature difference greater than a first threshold where the lower temperature is below a second threshold, etc.

To locate edges 226 and 228, pixels in left scan area 222 and right scan area 224 are analyzed. In particular, left scan area 222 is scanned from left to right. When a transition from a dark pixel (representing a low temperature) to a light pixel (representing a higher temperature) is located, left edge 226 of silicon rod 112 has been located. This process is repeated for right scan area 224, but scanning right to left to identify right edge 228.

Once the spatial limits of silicon rod 112 are established by locating left and right edges 226 and 228, the position of target 232 for temperature measurement is calculated as the midpoint between edges 226 and 228, i.e. center 230.

This process of seeking edges 226 and 228 of silicon rod 112 is performed repeatedly, and is suitably performed at a relatively high frequency. Thus, the position of target 232 is computed so that it is regularly adjusted to the motion of silicon rod 112 caused by shear stress exerted by the flowing gases. Generally, the more frequent the edges 226 and 228 are located, the more accurately target 232 may be placed near the actual center of silicon rod 112. In some embodiments, the process is repeated at a higher frequency than the oscillations of silicon rod 112. In other embodiments, the time between each inspection for edges 226 and 228 may be any suitable time duration within the capabilities of the hardware used in system 100.

Figure 3:
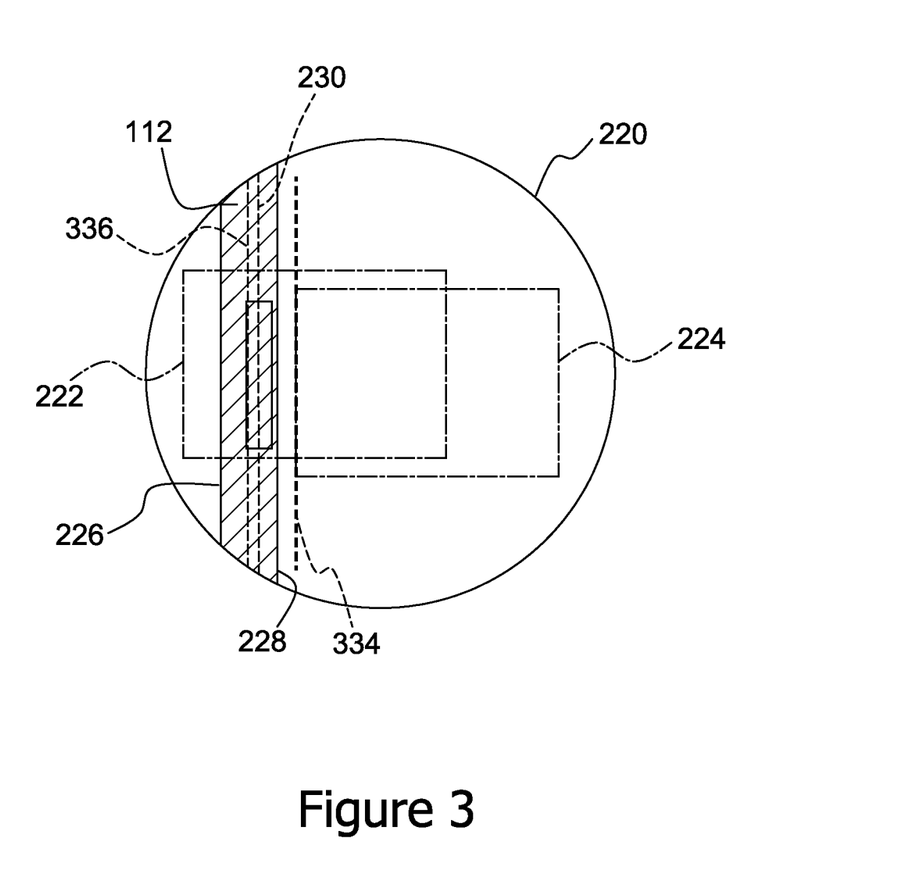
FIG. 3 is the field of view shown in FIG. 2 when the silicon rod has moved relative to the imaging device.

Turning to FIG. 3, there may be times when no transition may be detected in one of scan areas 222 and 224. This may occur when the position of silicon rod 112 exceeds the limits of the particular scan area 222 or 224. This is particularly likely early in the CVD process when silicon rods 112 are prone to large excursions. In such cases, system 100 uses the last recorded position for the undetected edge. Thus, in FIG. 3, right edge 228 of silicon rod 112 is outside of scan area 224. When scan areas 222 and 224 are scanned, no right edge is detected. Accordingly, the last recorded location of right edge 228, indicated by last edge 334, is used to indicate right edge 228. Because last edge 334 does not align with right edge 228, the computed center 230 is not the actual center 336 of silicon rod 112. Center 230 is, however, close enough to actual center 336 that target 232 remains on silicon rod 112 and relatively close to actual center 336. Thus, accurate temperature measurements may be achieved even during relatively large excursions of silicon rod 112.

Figure 4:
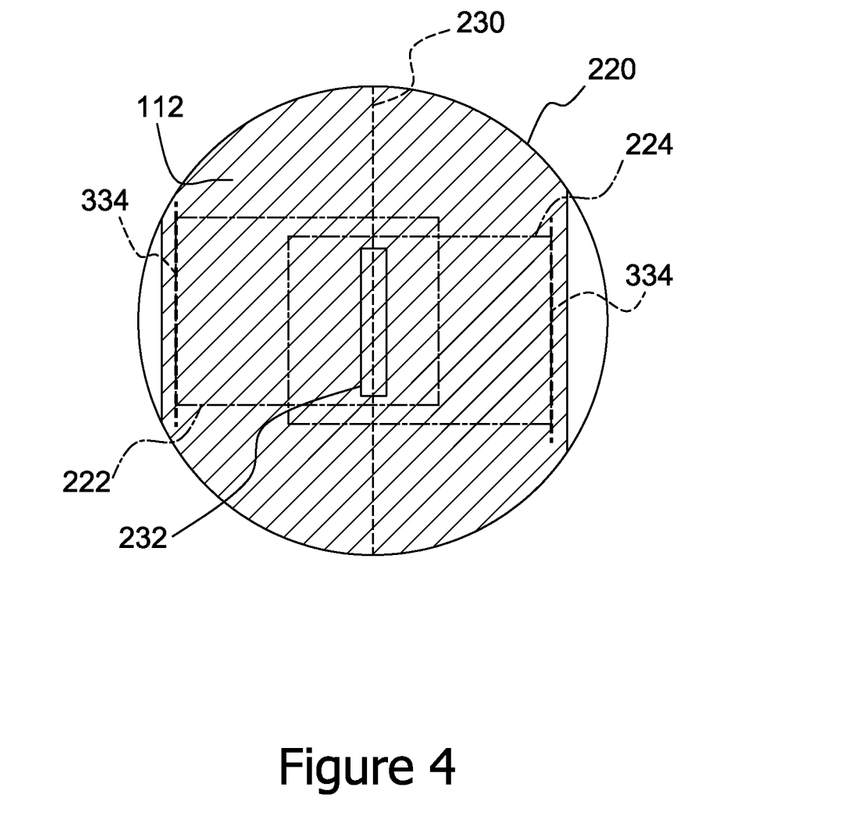
FIG. 4 is the field of view shown in FIG. 2 when the silicon rod has increased in size.

As shown in FIG. 4, after sufficient deposition has occurred, the diameter of silicon rods 112 has increased so that nearly the entire field of view 220 of imaging device 116 is occupied by the surface of silicon rod 112. More particularly, silicon rod 112 completely fills both scanning areas 222 and 224. When this state occurs, no transition from dark to light pixels is observed in either of areas 222 or 224. Because no edges are detected, last edges 334 are used to indicate the location of right and left edges 226 and 228. Thus, center 230 is calculated and target 232 is placed based on last edges 334. At this stage, tracking the target position is no longer necessary and the tracking described herein may cease. In the exemplary embodiment, when no transition from light to dark pixels, i.e., no edge, is located for one hundred seconds, the target 232 tracking algorithm may cease operating and enters a stand-by mode. In other embodiments, the amount of time without an observed transition may be any other suitable length of time. In still other embodiments, the tracking algorithm continues to operate without ceasing even though no transitions are observed.

Figure 5:
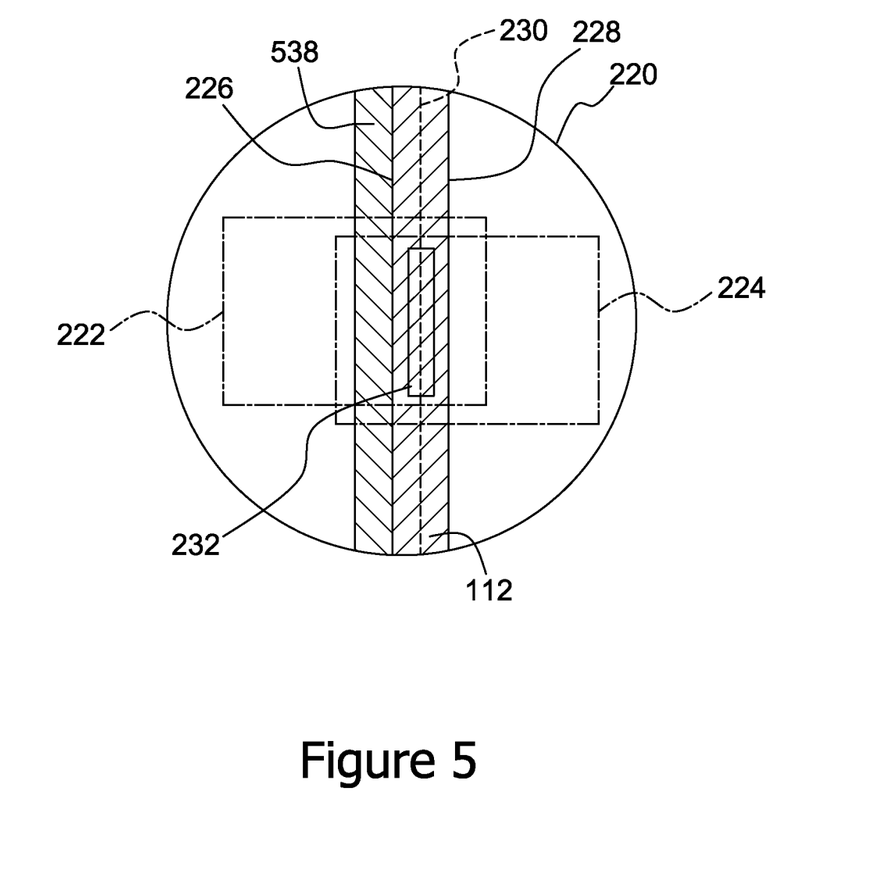
FIG. 5 is an illustration of a field of view of an imaging device of the system of FIG. 1, the field of view including two silicon rods overlapping within the field of view.

In case of silicon rods which may overlap within the field of view 220 of imaging device 116, the methods described herein may still be utilized. In order to locate edges 226 and 228 of the desired silicon rod 112, fine tuning of the temperature threshold value may be needed. As illustrated in FIG. 5, silicon rod 112 overlaps a second silicon rod 538 within field of view 220. The transition from dark to light pixels at left edge 226 is confined within a narrower range as compared to, for example, a field of view 220 with a single silicon rod 112, such as in FIGS. 2-4. Silicon rod 538 is generally located at further distance from imaging device 116 than the rod 112. The measured temperature of silicon rod 538 is thus generally slightly lower than silicon rod 112. By defining a threshold value which is closer to the temperature of silicon rod 112 in the foreground, silicon rod 538 in the background may be considered as part of a dark region. Thus, left edge 226 may be detected based on the temperature difference between silicon rod 538 and silicon rod 112.

Figure 6:
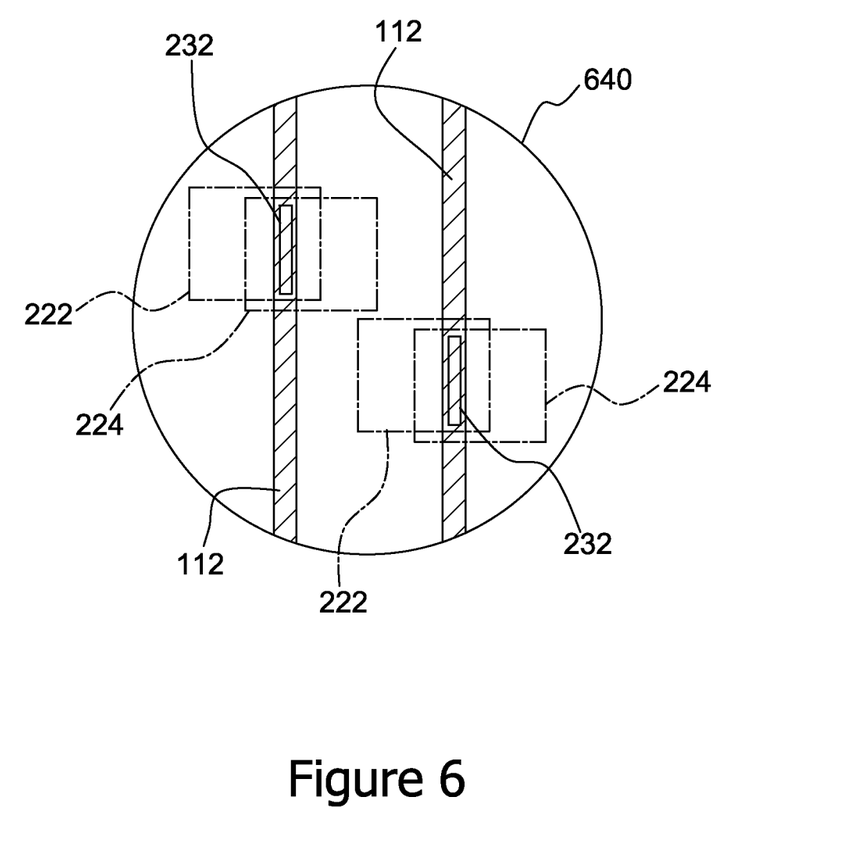
FIG. 6 is an illustration of a field of view of an imaging device of the system of FIG. 1, the field of view including two silicon rods.

Furthermore, the methods described herein may be used to monitor the temperature of multiple silicon rods 112 within a single field of view of one imaging device 112, whether overlapping or not. FIG. 6 illustrates a field of view 640 of on imaging device 116 in which two non-overlapping silicon rods 112 are visible. In this embodiment, four scan areas 222 and 224 are utilized as described above, one left scan area 222 and one right scan area 224 for each silicon rod 112. Thus, the surface temperature of two different rods 112 within the field of view 640 may be monitored. The number of rods 112 that may be monitored within one field of view is not limited to two and the temperature of more or fewer rods 112 may be monitored by a single imaging device 116. If silicon rods 112 overlap, or oscillate to such an extent as to appear to overlap, the thresholds used for identifying edges 226 and/or 228 may be adjusted as described above to account for the smaller observed temperature difference at edges 226 and/or 228. Further, each scan area 222 and 224 may use the same or different thresholds and the threshold for scan areas 222 and 224 for each rod 112 may be the same or different.

An additional, or alternative, feature of system 100 is the ability to quantify the diameter of the silicon rods 112 being monitored. While seeking the target as described above, the positions of the edges 226 and 228 of the rods 112 are computed. The difference between the edges 226 and 228 provides a measurement of the diameter of the particular silicon rod 112 being monitored.

Image based systems and monitoring and control methods as described herein may achieve superior results to some known methods. For example, more accurate temperature monitoring may be achieved by more accurately locating the silicon rods and sensing the temperature around the center of the silicon rods. More accurate temperature measurement may improve control of the deposition process, resulting in increased performance in terms of deposition rate and morphology. Furthermore, more accurate temperature measurement may result in reduced energy consumption. Furthermore, accurate measurements of the diameter of silicon rods may be obtained. Knowledge of the actual diameter of a silicon rod at any given time may improve control over the CVD process, improve energy efficiency, and/or improve the quality of the resulting silicon.

Some embodiments involve the use of one or more electronic or computing devices. Such devices typically include a processor or controller, such as a general purpose central processing unit (CPU), a graphics processing unit (GPU), a microcontroller, a reduced instruction set computer (RISC) processor, an application specific integrated circuit (ASIC), a programmable logic circuit (PLC), and/or any other circuit or processor capable of executing the functions described herein. The methods described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term processor.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A method of monitoring a surface temperature of at least one silicon rod in a chemical vapor deposition (CVD) reactor during a CVD process, the method comprising:
   capturing an image of an interior of the CVD reactor, the image including a silicon rod, wherein the capturing an image comprises capturing a digital image of the interior of the CVD reactor;
   scanning the image to identify a left edge of the silicon rod and a right edge of the silicon rod, wherein the scanning the image comprises analyzing individual pixels of the image to locate a transition from a lower temperature to a higher temperature;
   identifying a target area midway between the identified left edge and the identified right edge; and
   determining a temperature of the silicon rod in the identified target area.

2. A method according to claim 1, further comprising:
   controlling a surface temperature of the silicon rod based on the determined temperature of the silicon rod in the target area.

3. A method of monitoring a surface temperature of at least one silicon rod in a chemical vapor deposition (CVD) reactor during a CVD process, the method comprising:
   capturing an image of an interior of the CVD reactor, the image including a silicon rod, wherein the capturing an image comprises capturing a digital image of the interior of the CVD reactor, and wherein capturing the digital image comprises capturing a digital image of a visible wavelength of radiation within the CVD reactor;
   scanning the image to identify a left edge of the silicon rod and a right edge of the silicon rod;

identifying a target area midway between the identified left edge and the identified right edge; and determining a temperature of the silicon rod in the identified target area.

4. A method of monitoring a surface temperature of at least one silicon rod in a chemical vapor deposition (CVD) reactor during a CVD process, the method comprising:

capturing an image of an interior of the CVD reactor, the image including a silicon rod;

scanning the image to identify a left edge of the silicon rod and a right edge of the silicon rod;

identifying a target area midway between the identified left edge and the identified right edge; and determining a temperature of the silicon rod in the identified target area, wherein the determining a temperature of the silicon rod in the target area comprises comparing a radiation intensity of the silicon rod captured in the image to a radiation intensity of a reference image.

5. A method of monitoring a surface temperature of at least one silicon rod in a chemical vapor deposition (CVD) reactor during a CVD process, the method comprising:

capturing an image of an interior of the CVD reactor, the image including a silicon rod;

scanning the image to identify a left edge of the silicon rod and a right edge of the silicon rod;

identifying a target area midway between the identified left edge and the identified right edge;

determining a temperature of the silicon rod in the identified target area; and controlling a surface temperature of the silicon rod based on the determined temperature of the silicon rod in the target area, wherein the controlling a surface temperature comprises utilizing the determined temperature as feedback for a power supply coupled to provide electrical power to the silicon rod.

6. A method according to claim 5, wherein the CVD reactor is a Siemens reactor.

7. A method according to claim 5, wherein the capturing an image comprises capturing a digital image of the interior of the CVD reactor, and further wherein the scanning the image comprises analyzing pixels of the image to locate a transition from a lower temperature to a higher temperature.

8. A system comprising:

a chemical vapor deposition (CVD) reactor including an interior;

a plurality of silicon rods coupled within the interior of the CVD reactor;

an imaging device positioned to capture an image of the interior of the CVD reactor and at least one silicon rod of the plurality of silicon rods;

a controller configured to:

scan the image to identify a left edge of the silicon rod and a right edge of the silicon rod;

identify a target area midway between the identified left edge and the identified right edge;

determine a temperature of the silicon rod in the identified target area;

wherein the system further comprises a power supply coupled to the silicon rod, the power supply providing electrical power to the silicon rod to control the temperature of the silicon rod, wherein the controller is further configured to utilize the determined temperature as feedback for the power supply.

9. A system according to claim 8, wherein the CVD reactor is a Siemens reactor.

10. A system according to claim 8, wherein the plurality of silicon rods comprises twenty or more silicon rods.

11. A system according to claim 8, wherein the plurality of silicon rods comprises fifty-four silicon rods.

12. A system according to claim 8, wherein the controller is further configured to determine a diameter of the silicon rod in the image.

13. A system according to claim 8, wherein the imaging device comprises a digital imaging device, and further wherein the controller is configured to scan the image to identify a left edge of the silicon rod and a right edge of the silicon rod by analyzing pixels of the image to locate a transition from a lower temperature to a higher temperature.

14. A system comprising:

a chemical vapor deposition (CVD) reactor including an interior;

a plurality of silicon rods coupled within the interior of the CVD reactor;

an imaging device positioned to capture an image of the interior of the CVD reactor and at least one silicon rod of the plurality of silicon rods, wherein the imaging device comprises a digital imaging device;

a controller configured to:

scan the image to identify a left edge of the silicon rod and a right edge of the silicon rod by analyzing individual pixels of the image to locate a transition from a lower temperature to a higher temperature;

identify a target area midway between the identified left edge and the identified right edge;

determine a temperature of the silicon rod in the identified target area.

15. A system according to claim 14, wherein the digital imaging device comprises a visible wavelength digital imaging device.

16. A system according to claim 15 wherein the imaging device comprises a charge-coupled device (CCD) sensor.

17. A system according to claim 14, wherein the controller is further configured to determine a diameter of the silicon rod in the image based at least in part on the identified left edge of the silicon rod and the right edge of the silicon rod.

18. A system comprising:

a chemical vapor deposition (CVD) reactor including an interior;

a plurality of silicon rods coupled within the interior of the CVD reactor;

an imaging device positioned to capture an image of the interior of the CVD reactor and at least one silicon rod of the plurality of silicon rods;

a controller configured to:

scan the image to identify a left edge of the silicon rod and a right edge of the silicon rod;

identify a target area midway between the identified left edge and the identified right edge;

determine a temperature of the silicon rod in the identified target area;

wherein the controller is configured to determine a temperature of the silicon rod in the target area by comparing a radiation intensity of the silicon rod captured in the image to a radiation intensity of a reference image.

19. A system comprising:

a chemical vapor deposition (CVD) reactor including an interior;

a plurality of silicon rods coupled within the interior of the CVD reactor;

an imaging device positioned to capture an image of the interior of the CVD reactor and at least one silicon rod of the plurality of silicon rods;

a controller configured to:

scan the image to identify a left edge of the silicon rod and a right edge of the silicon rod;
utilize a previously identified left edge or right edge of the silicon rod as the identified left edge or right edge of the silicon rod when the controller fails to identify the left edge or right edge of the silicon rod;
identify a target area midway between the identified left edge and the identified right edge;
determine a temperature of the silicon rod in the identified target area.

20. A system according to claim 19, wherein the imaging device comprises a digital imaging device, and further wherein the controller is configured to scan the image to identify a left edge of the silicon rod and a right edge of the silicon rod by analyzing pixels of the image to locate a transition from a lower temperature to a higher temperature.

* * * * *